United States Patent
Guo et al.

(10) Patent No.: US 10,871,537 B1
(45) Date of Patent: Dec. 22, 2020

(54) SYSTEMS AND METHODS FOR BACKGROUND SUPPRESSION IN TIME-OF-FLIGHT MAGNETIC RESONANCE ANGIOGRAPHY

(71) Applicant: GE Precision Healthcare LLC, Wauwatosa, WI (US)

(72) Inventors: Jia Guo, Beijing (CN); Yongchuan Lai, Beijing (CN); Pengfei Lu, Beijing (CN); Xuan Liu, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 16/445,440

(22) Filed: Jun. 19, 2019

(51) Int. Cl.
*G01R 33/563* (2006.01)
*G01R 33/3815* (2006.01)
*G01R 33/48* (2006.01)
*G01R 33/56* (2006.01)

(52) U.S. Cl.
CPC ..... *G01R 33/5635* (2013.01); *G01R 33/3815* (2013.01); *G01R 33/4818* (2013.01); *G01R 33/5608* (2013.01)

(58) Field of Classification Search
CPC ............ G01R 33/5635; G01R 33/5608; G01R 33/3815; G01R 33/4818
See application file for complete search history.

(56) References Cited

U.S. PATENT DOCUMENTS

2014/0081123 A1* 3/2014 Korosec ............... A61B 5/7285
600/413

OTHER PUBLICATIONS

Chan, Jimmy H. M., et al., "Three-Dimensional Time-of-Flight Subtraction Angiography of Subacute Cerebral Hemorrhage", American Journal of Roentgenology. 2003;181: 242-244.
Shu-Hui Peng, et al., "Image quality improvement in three-dimensional time-of-flight magnetic resonance angiography using the subtraction method for brain and temporal bone diseases", Journal of the Chinese Medical Association 76 (2013) 458-465.

* cited by examiner

*Primary Examiner* — Rishi R Patel

(57) ABSTRACT

Systems and methods for suppressing background in time-of-flight (TOF) magnetic resonance angiography (MRA) are disclosed. An exemplary method includes obtaining a first TOF image through a high-resolution acquisition with a saturation band on one side of an imaging slab, obtaining a second TOF image through a low-resolution acquisition with two saturation bands on both sides of the imaging slab, and subtracting the second TOF image from the first TOF image to obtaining a subtraction TOF image. Post processing such as maximum intensity projection (MIP) is performed on the subtraction TOF image.

20 Claims, 7 Drawing Sheets

SYSTEMS AND METHODS FOR BACKGROUND SUPPRESSION IN TIME-OF-FLIGHT MAGNETIC RESONANCE ANGIOGRAPHY

FIELD

This disclosure relates to magnetic resonance imaging (MRI), and more particularly, to background suppression in time-of-flight (TOF) magnetic resonance angiography (MRA).

BACKGROUND

MRA uses the inherent motion sensitivity of MRI to produce images of vascular structures. Magnetic resonance (MR) angiograms are acquired by exciting nuclei in a selected volume of interest and detecting the signal contrast between moving nuclei and stationary nuclei within that volume. TOF is the most widely used MRA for imaging head and neck vasculature, which relies on inflow replenishment to create contrast between flowing blood and stationary tissue. TOF can be performed using either a two-dimensional (2D) or three-dimensional (3D) acquisition. In a 2D TOF, multiple thin (e.g., 1-2 mm thick) slices are obtained sequentially as a stack in a plane perpendicular to the course of the imaged blood vessels. In a 3D TOF, radio frequency (RF) excitation is applied to a relatively thick slab (e.g., 50 mm thick) and the signal is acquired from the entire volume of excited material. The result of an MRA is typically a 3D dataset composed of either sequential 2D sections or true 3D data. A projection image is produced by mapping the signal onto a desired viewing plane by means of maximum intensity projection (MIP). The MIP image can be generated in any desired viewing plane and provides an overview of the geometry of the vasculature.

In general, MRA aims to create images with maximum vessel-to-background contrast, which can be achieved by suppressing the background signal from static tissue. In TOF MRA, high signal from tissue with short T1 relaxation time, particularly fat, may compete with the signal from the flowing blood and interfere with visualization of distal vessels on TOF images and MIP images. One approach is to restrict the region in a TOF image to be included in the MIP post processing. For example, in a TOF brain image, a layer near the scalp, which contains more fat, is manually cut off from the image and then MIP is performed on the rest of the TOF image so that better contrast can be achieved. It may take a user minutes to manually restrict the region in the TOF image. Another approach is to use fat saturation and/or magnetization transfer (MT) to suppress signals from fat and other static matters. However, fat saturation and MT may complicate the pulse sequence design, prolong the scan time, and may be sensitive to the $B_0$ and $B_1$ inhomogeneity. As such, improved systems and methods for background suppression in TOF MRA is generally desired.

SUMMARY

In one embodiment, the present disclosure provides a method for suppressing background in TOF MRA. The method comprises obtaining a first TOF image through a high-resolution acquisition with a saturation band on one side of an imaging slab, obtaining a second TOF image through a low-resolution acquisition with two saturation bands on both sides of the imaging slab, and obtaining a subtraction TOF image which represents difference between the first and second TOF images.

In another embodiment, the present disclosure provides an MRI system. The MRI system comprises a superconducting magnet configured to generate a homogenous longitudinal magnetic field, a radio frequency (RF) coil configured to transmit RF pulses, gradient coils configured to generate gradient magnetic field, and a processor coupled to the RF coil and the gradient coils. The processor is configured to control the RF coil and the gradient coils to perform a high-resolution time-of-flight (TOF) acquisition with a saturation band on one side of an imaging slab and control the RF coil and the gradient coils to perform a low-resolution TOF acquisition with two saturation bands on both sides of the imaging slab.

BRIEF DESCRIPTION OF THE DRAWINGS

Various aspects of this disclosure may be better understood upon reading the following detailed description and upon reference to the drawings in which.

Figure 1:
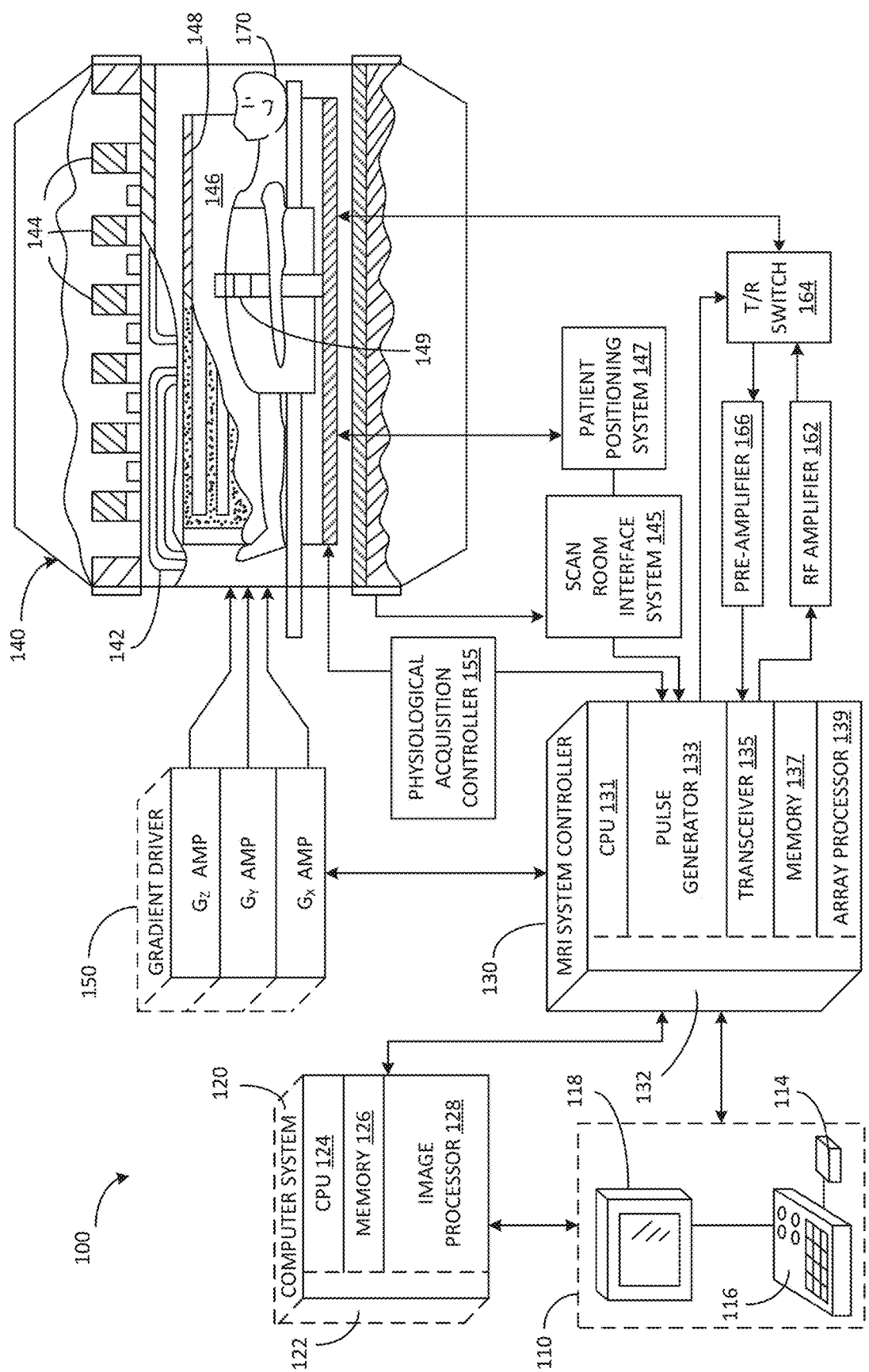
FIG. 1 is a schematic diagram of a magnetic resonance imaging (MRI) system, in accordance with an exemplary embodiment.

The drawings illustrate specific aspects of the described components, systems and methods for background suppression in 3D TOF MRA. Together with the following description, the drawings demonstrate and explain the principles of the structures, methods, and principles described herein. In the drawings, the thickness and size of components may be exaggerated or otherwise modified for clarity. Well-known structures, materials, or operations are not shown or described in detail to avoid obscuring aspects of the described components, systems and methods.

DETAILED DESCRIPTION

One or more specific embodiments of the present disclosure are described below in order to provide a thorough understanding. These described embodiments are only examples of the systems and methods for background suppression in 3D TOF MRA. The skilled artisan will understand that specific details described in the embodiments can be modified when being placed into practice without deviating the spirit of the present disclosure.

When introducing elements of various embodiments of the present disclosure, the articles "a," "an," and "the" are intended to mean that there are one or more of the elements.

The terms "first," "second," and the like, do not denote any order, quantity, or importance, but rather are used to distinguish one element from another. The terms "comprising," "including," and "having" are intended to be inclusive and mean that there may be additional elements other than the listed elements. As the terms "connected to," "coupled to," etc. are used herein, one object (e.g., a material, element, structure, member, etc.) can be connected to or coupled to another object regardless of whether the one object is directly connected or coupled to the other object or whether there are one or more intervening objects between the one object and the other object. In addition, it should be understood that references to "one embodiment" or "an embodiment" of the present disclosure are not intended to be interpreted as excluding the existence of additional embodiments that also incorporate the recited features.

Referring to the figures generally, the present disclosure describes systems and methods for background suppression in 3D TOF MRA. TOF relies on flow-dependent changes in longitudinal magnetization resulting from the motion of protons flowing into or out of an imaging volume during a given pulse sequence. In a 3D TOF, a relatively thick slab of tissue is excited and then sub-divided into thin slices or partitions by a second phase-encoding process in the slice-selection direction. As such, the signal to noise ratio (SNR) can be improved compared to 2D TOF. However, the SNR improvement also applies to the background tissue which may limit the vessel-to-background contrast. Therefore, 3D TOF needs better background signal suppression to visualize small vessels in MIP images. One approach is to limit the region of a TOF image to be included in the MIP post processing, which involves a manual process and may take a user minutes to perform. Another approach is to use fat saturation and/or magnetization transfer (MT) to suppress signals from fat and other static matters. However, fat saturation and MT may complicate the pulse sequence design, prolong the scan time, and may be sensitive to the $B_0$ and $B_1$ inhomogeneity.

Chan et al. introduced subtraction 3D TOF MRA to remove hyperintense hematoma. ("Three-dimensional time-of-flight subtraction angiography of subacute cerebral hemorrhage," *AJR Am J Roentgenol* 2003; 181: 242-4). In Chan's method, a first 3D TOF acquisition was performed without spatial saturation bands. A second 3D TOF acquisition was then performed "using the same pulse sequence, imaging parameters, and identical slice locations except that superior and inferior spatial saturation (i.e., presaturation) slabs were added." Then the first TOF MRA image was subtracted from the second. According to Chan, the scan time for acquiring two sets of 3D TOF MR angiograms was in the range of 10-12 minutes. The long scan time may further increase the risk of misregistration artifacts. As such, Chan suggested to educate the patient, to fix the head by straps, and to minimize the time gap between the two acquisitions, in order to minimize patient movement. Chan seemed to emphasize that using the same pulse sequence, same imaging parameters (including the same resolution), and same slice locations in the two 3D TOF acquisitions was important. Practically, it is hard to have a patient stay still for this long scan time. Therefore, Chan's method was used for research purpose only. Commercial products still use fat saturation and MT to suppress background signal.

In an exemplary method of the present disclosure, two TOF images are obtained. The first TOF image is obtained through a high-resolution acquisition with a saturation band being applied on one side of the slab and the full k-space being sampled for the slab. The second TOF image is obtained through a low-resolution acquisition with two saturation bands being applied on both sides of the slab and the partial k-space being sampled for the slab. Scan time for the second TOF image is significantly shorter than that for the first TOF image. For example, the high-resolution acquisition may take a few minutes (e.g., 3 minutes) to perform while the low-resolution acquisition may take several seconds (e.g., 5-10 seconds) to acquire. A subtraction TOF image is obtained by subtracting the second TOF image from the first TOF image. Because the first TOF image includes signal from both the static tissue and flowing blood while the second TOF image includes signal from only the static tissue, signal from the static tissue can be canceled out while signal from the flowing blood is left in the subtraction image. Thus the background signal can be suppressed. In this method, no extra fat saturation or MT pulse is needed. Addition to the scan time is very limited (e.g., 10% increase) because the second low-resolution TOF acquisition only takes several seconds to perform. And since background signal is well suppressed in the subtraction TOF image, MIP can be performed directly on the subtraction TOF image without restricting the region for post processing.

Referring now to FIG. 1, a schematic diagram of an exemplary MRI system 100 is shown in accordance with an exemplary embodiment. The operation of MRI system 100 is controlled from an operator workstation 110 which includes an input device 114, a control panel 116, and a display 118. The input device 114 may be a joystick, keyboard, mouse, track ball, touch activated screen, voice control, or any similar or equivalent input device. The control panel 116 may include a keyboard, touch activated screen, voice control, buttons, sliders, or any similar or equivalent control device. The operator workstation 110 is coupled to and communicates with a computer system 120 that enables an operator to control the production and viewing of images on display 118. The computer system 120 includes a plurality of components that communicate with each other via electrical and/or data connections 122. The computer system connections 122 may be direct wired connections, fiber optic connections, wireless communication links, or the like. The computer system 120 may include a central processing unit (CPU) 124, a memory 126, and an image processor 128. In some embodiments, the image processor 128 may be replaced by image processing functionality implemented in the CPU 124. The computer system 120 may be connected to archival media devices, permanent or back-up memory storage, or a network. The computer system 120 is coupled to and communicates with a separate MRI system controller 130.

The MRI system controller 130 includes a set of components in communication with each other via electrical and/or data connections 132. The MRI system controller connections 132 may be direct wired connections, fiber optic connections, wireless communication links, or the like. The MRI system controller 130 may include a CPU 131, a pulse generator/sequencer 133 communicating with the operator workstation 110, a transceiver 135, a memory 137, and an array processor 139. In some embodiments, the pulse generator/sequencer 133 may be integrated into a resonance assembly 140 of the MRI system 100. The MRI system controller 130 may receive commands from the operator workstation 110 to indicate the MRI scan sequence to be performed during an MRI scan. The MRI system controller 130 is also coupled to and communicates with a gradient driver system 150, which is coupled to a gradient coil assembly 142 to produce magnetic field gradients during an MRI scan.

The pulse generator/sequencer 133 may also receive data from a physiological acquisition controller 155 which receives signals from a plurality of different sensors connected to an object or patient 170 undergoing an MRI scan, such as electrocardiography (ECG) signals from electrodes attached to the patient. And finally, the pulse generator/sequencer 133 is coupled to and communicates with a scan room interface system 145, which receives signals from various sensors associated with the condition of the resonance assembly 140. The scan room interface system 145 is also coupled to and communicates with a patient positioning system 147, which sends and receives signals to control movement of a patient table to a desired position for an MRI scan.

The MRI system controller 130 provides gradient waveforms to the gradient driver system 150, which includes, among others, $G_X$, $G_Y$ and $G_Z$ amplifiers. Each $G_X$, $G_Y$ and $G_Z$ gradient amplifier excites a corresponding gradient coil in the gradient coil assembly 142 to produce magnetic field gradients used for spatially encoding MR signals during an MRI scan. The gradient coil assembly 142 is included within the resonance assembly 140, which also includes a superconducting magnet having superconducting coils 144, which in operation, provides a homogenous longitudinal magnetic field $B_0$ throughout a cylindrical imaging volume 146 that is enclosed by the resonance assembly 140. The resonance assembly 140 also includes a RF body coil 148 which in operation, provides a transverse magnetic field $B_1$ that is generally perpendicular to $B_0$ throughout the open cylindrical imaging volume 146. The resonance assembly 140 may also include RF surface coils 149 used for imaging different anatomies of a patient undergoing an MRI scan. The RF body coil 148 and RF surface coils 149 may be configured to operate in a transmit and receive mode, transmit mode, or receive mode.

An object or patient 170 undergoing an MRI scan may be positioned within the cylindrical imaging volume 146 of the resonance assembly 140. The transceiver 135 in the MRI system controller 130 produces RF excitation pulses that are amplified by an RF amplifier 162 and provided to the RF body coil 148 through a transmit/receive switch (T/R switch) 164.

As mentioned above, RF body coil 148 and RF surface coils 149 may be used to transmit RF excitation pulses and/or to receive resulting MR signals from a patient undergoing an MRI scan. The resulting MR signals emitted by excited nuclei in the patient undergoing an MRI scan may be sensed and received by the RF body coil 148 or RF surface coils 149 and sent back through the T/R switch 164 to a pre-amplifier 166. The amplified MR signals are demodulated, filtered and digitized in the receiver section of the transceiver 135. The T/R switch 164 may be controlled by a signal from the pulse generator/sequencer 133 to electrically connect the RF amplifier 162 to the RF body coil 148 during the transmit mode and connect the pre-amplifier 166 to the RF body coil 148 during the receive mode. The T/R switch 164 may also enable RF surface coils 149 to be used in either the transmit mode or receive mode.

The resulting MR signals sensed and received by the RF body coil 148 or RF surface coils 149 are digitized by the transceiver 135 and transferred to the memory 137 in the MRI system controller 130.

An MR scan is complete when an array of raw k-space data, corresponding to the received MR signals, has been acquired and stored temporarily in the memory 137 until the data is subsequently transformed to create images. This raw k-space data is rearranged into separate k-space data arrays for each image to be reconstructed, and each of these separate k-space data arrays is input to the array processor 139, which operates to Fourier transform the data into arrays of image data.

The array processor 139 uses a known transformation method, most commonly a Fourier transform, to create images from the received MR signals. These images are communicated to the computer system 120 where they are stored in memory 126. In response to commands received from the operator workstation 110, the image data may be archived in long-term storage or it may be further processed by the image processor 128 and conveyed to the operator workstation 110 for presentation on the display 118.

In various embodiments, the components of computer system 120 and MRI system controller 130 may be implemented on the same computer system or a plurality of computer systems.

Figure 2:
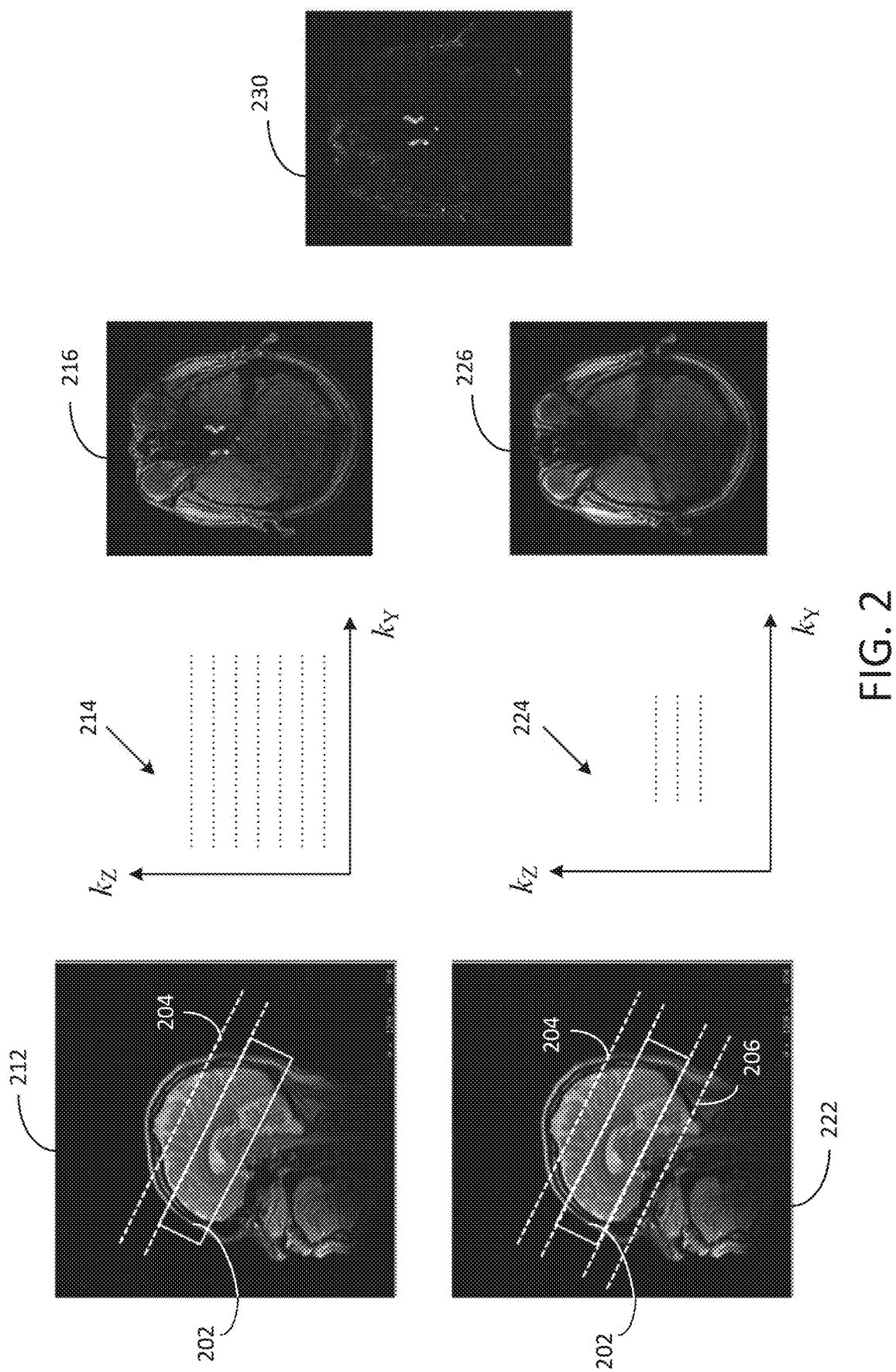
FIG. 2 is a schematic illustration of background suppression in 3D TOF MRA, in accordance with an exemplary embodiment.
Figure 3A:
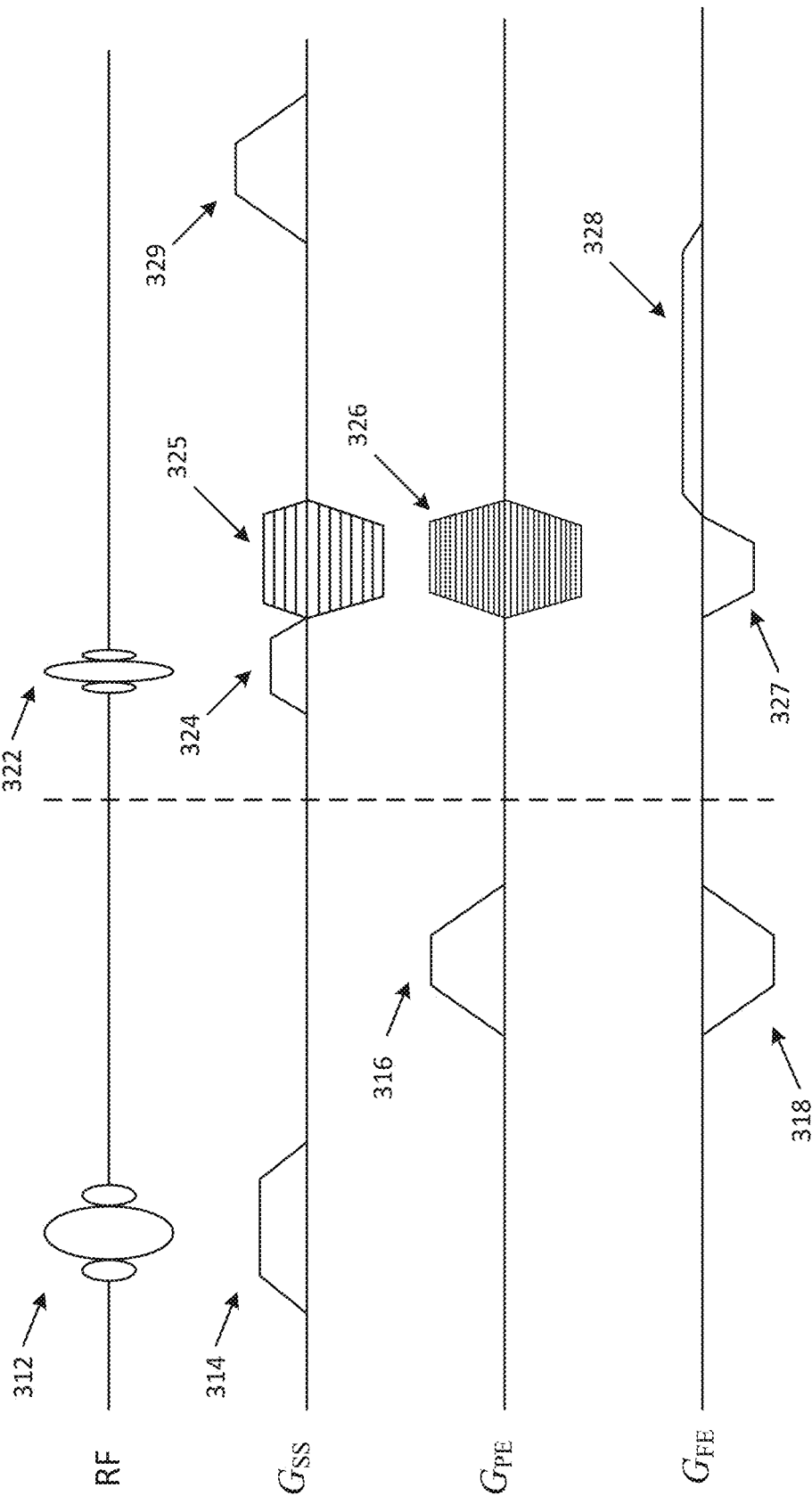
FIG. 3A is a schematic graph of pulse sequence for acquiring the first 3D TOF image, in accordance with an exemplary embodiment.

Referring to FIG. 2, a schematic illustration of background suppression in 3D TOF MRA is shown, in accordance with an exemplary embodiment. Two TOF images 216 and 226 are acquired. The first TOF image 216 is obtained through a high-resolution acquisition 212 by applying a saturation band 204 on one side of an imaging slab (or imaging volume) 202 and sampling the full k-space 214 for the imaging slab 202. FIG. 3A shows an exemplary pulse sequence for acquiring the first TOF image 216.

As shown in FIG. 3A, the pulse sequence includes a saturation pulse sequence 310 and TOF acquisition pulse sequence 320. Saturation 310 applies a 90° RF pulse 312 in the presence of slice selection pulse 314 so that nuclei spins within the saturation band 204 above the imaging slab 202 are flipped into the transverse plane. Dephasing gradients (also known as spoilers) 316 and 318 are then applied to dephase the transverse magnetization. Thus, when venous blood flows from the saturation band 204 into the imaging slab 202, the nuclei spins are already saturated and give no signal. Saturation 310 may be applied for each repetition time (TR) period.

Following saturation 310, TOF acquisition 320 applies an RF excitation pulse 322 in the presence of slice selection pulse 324 so that nuclei spins within the imaging slab 202 are flipped. In some embodiments, the flip angle of the RF excitation pulse 322' is input by a user through a user interface. Then a gradient pulse 325 is applied to slice encode along the axis of slice selection (Z-axis) and a gradient pulse 326 to phase encode along the axis of phase encoding (Y-axis). The gradient pulse 325 is stepped through, for example, 16 values during the scan to separately encode 16 slices in the excited slab 202. The gradient pulse 326 is stepped through, for example, 128 values during the scan, corresponding to the number of sampled $k_Y$ in the k-space. Following a pre-phasing readout gradient lobe 327, a number of samples (e.g., 128 corresponding to the sampled $k_X$ in the k-space) are acquired during a readout gradient 328. In some embodiments, a dephasing gradient 329 may be applied following the readout gradient 328.

As described above, nuclei spins within the imaging slab 202 are flipped after the RF excitation pulse 322 is applied. At least some of the excited blood within the imaging slab 202 is replaced during the repetition time, TR, by in-flow blood, including venous blood flowing from 204 and arterial blood flowing from 206. The venous blood from 204 is also saturated and gives no signal. The in-flow arterial blood from 206 has not experienced any previous RF pulses and the spins have full longitudinal magnetization. As a result, in the first TOF image 216 reconstructed by, for example, 3D Fourier transform, the arterial blood vessels have higher intensity than the stationary tissue and venous blood vessels.

It should be understood that the schematic pulse sequence shown in FIG. 3A is for illustration not for limitation. Another appropriate pulse sequence can be used to acquire the first TOF image 216.

Figure 3B:
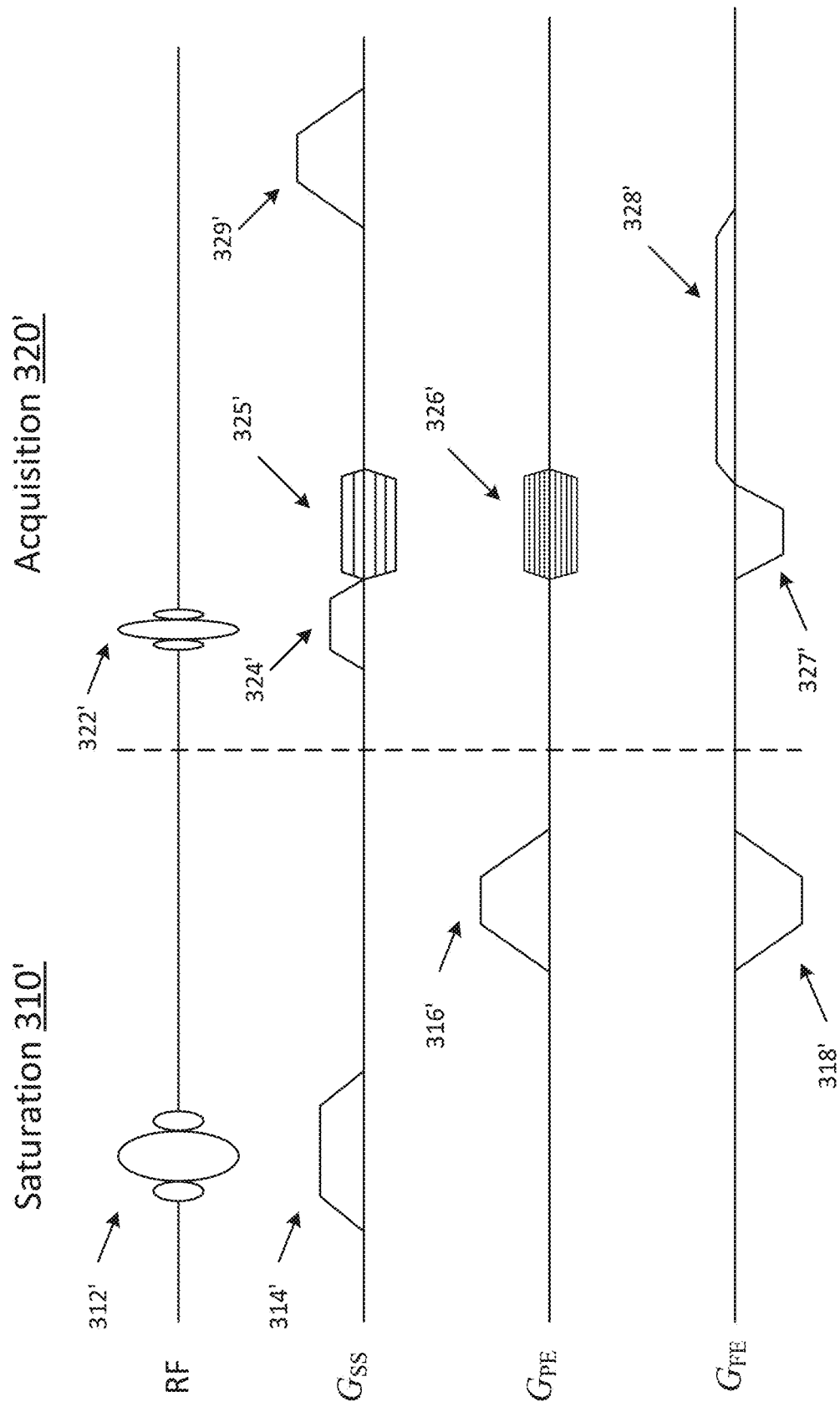
FIG. 3B is a schematic graph of pulse sequence for acquiring the second 3D TOF image, in accordance with an exemplary embodiment.

Referring back to FIG. 2, the second TOF image 226 is obtained through a low-resolution acquisition 222 by applying saturation bands 204 and 206 on both sides of the imaging slab 202 and sampling partial k-space 224. FIG. 3B shows an exemplary pulse sequence for acquiring the second TOF image 226. Similar to FIG. 3A, in FIG. 3B, the pulse sequence includes saturation pulse sequence 310' and TOF acquisition pulse sequence 320'. Saturation 310' applies a 90° RF pulse 312' in the presence of slice selection pulse 314' so that nuclei spins within the saturation band 204 above the imaging slab 202 and the saturation band 206 below the imaging slab 202 are flipped into the transverse plane. The RF pulse 312' has two frequency centers and corresponding bandwidths to cover the saturation bands 204 and 206, respectively; while the RF pulse 312 in FIG. 3A has one frequency center and bandwidth to cover the band 204 only. Dephasing gradients 316' and 318' are then applied to dephase the transverse magnetization. Thus, when venous blood from the saturation band 204 and arterial blood flow into the imaging volume 202, the nuclei spins are already saturated and give no signal. Saturation 310' may be applied for each repetition time (TR) period.

Following saturation 310', TOF acquisition 320' applies an RF excitation pulse 322' in the presence of slice selection pulse 324' so that nuclei spins within the imaging slab 202 are flipped. In some embodiments, the flip angle of the RF excitation pulse 322' is input by a user through a user interface. Then a gradient pulse 325' is applied to slice encode along the axis of slice selection (Z-axis) and a gradient pulse 326' to phase encode along the axis of phase encoding (Y-axis). The gradient pulse 325' is stepped through fewer values than the gradient pulse 325. The gradient pulse 326' is stepped through fewer values than the gradient pulse 326. As such, fewer $k_Y$ and $k_Z$ are sampled in the k-space in the second acquisition 222 than in the first acquisition 212. In other words, the full k-space (e.g., 214) is sampled in the first acquisition 212, while only the middle of the k-space (e.g., 224) is sampled in the second acquisition 222. Following a pre-phasing readout gradient lobe 327', a number of samples are acquired during a readout gradient 328'. In some embodiments, the number of samples along the frequency encoding direction (X-axis) may be the same for the first and second acquisition so that the TR remains the same. In some embodiments, not all points sampled during TR are used in the reconstruction of the image. In some embodiments, a dephasing gradient 329' may be applied following the readout gradient 328'.

The second acquisition 222 takes much shorter time to perform than the first acquisition 212. Scan time is proportional to the number of slice encoding by the number of phase encoding. For example, if in the second acquisition 222, the number of slice encoding is 4 (comparing to 16 in the first acquisition 212) and the number of phase encoding is 32 (comparing to 128 in the first acquisition 212), the scan time for the second acquisition can be as short as ~1/16 of the scan time for the first acquisition. If the high-resolution acquisition takes 3 minutes to perform, the low-resolution image may take about 10 seconds to perform. When the high spatial frequencies at the peripheral of the k-space are left unsampled, the right contrast may remain while details may be lost in the data. In reconstruction, the unsampled k-space may be filled with values of zero (0).

As discussed above, nuclei spins within the imaging volume 202 are flipped after the RF excitation pulse 322' is applied. At least some of the excited blood within the imaging 202 is replaced during the repetition time, TR, by venous blood flowing from 204 and arterial blood flowing from 206. Both venous blood from 204 and arterial blood from 206 are saturated and give no signal. As a result, in the second TOF image 226 reconstructed by, for example, 3D Fourier transform with zero filling, the arterial blood and venous blood vessels give no signal and only background signals remain.

Referring back to FIG. 2, a subtraction TOF image 230 is obtained by subtracting the second TOF image 226 from the first TOF image 216. Because the unsampled k-space is filled with values of zero, the second TOF image 226 can have the same number of pixels as the first TOF image 216 and the subtraction can be done pixel by pixel (or voxel by voxel). Because the first TOF image 216 includes signal from both stationary tissue and arterial blood while the second TOF image 226 includes signal from only stationary tissue, signal of the static tissue is canceled out in the subtraction image and only arterial blood information is left. In this way, the background signal can be suppressed. As can be seen, no extra fat saturation or MT pulse is needed in the method discloser herein. Addition to the scan time is very limited (e.g., 10% increase) because the second low-resolution acquisition only takes several seconds to perform.

Figure 4:
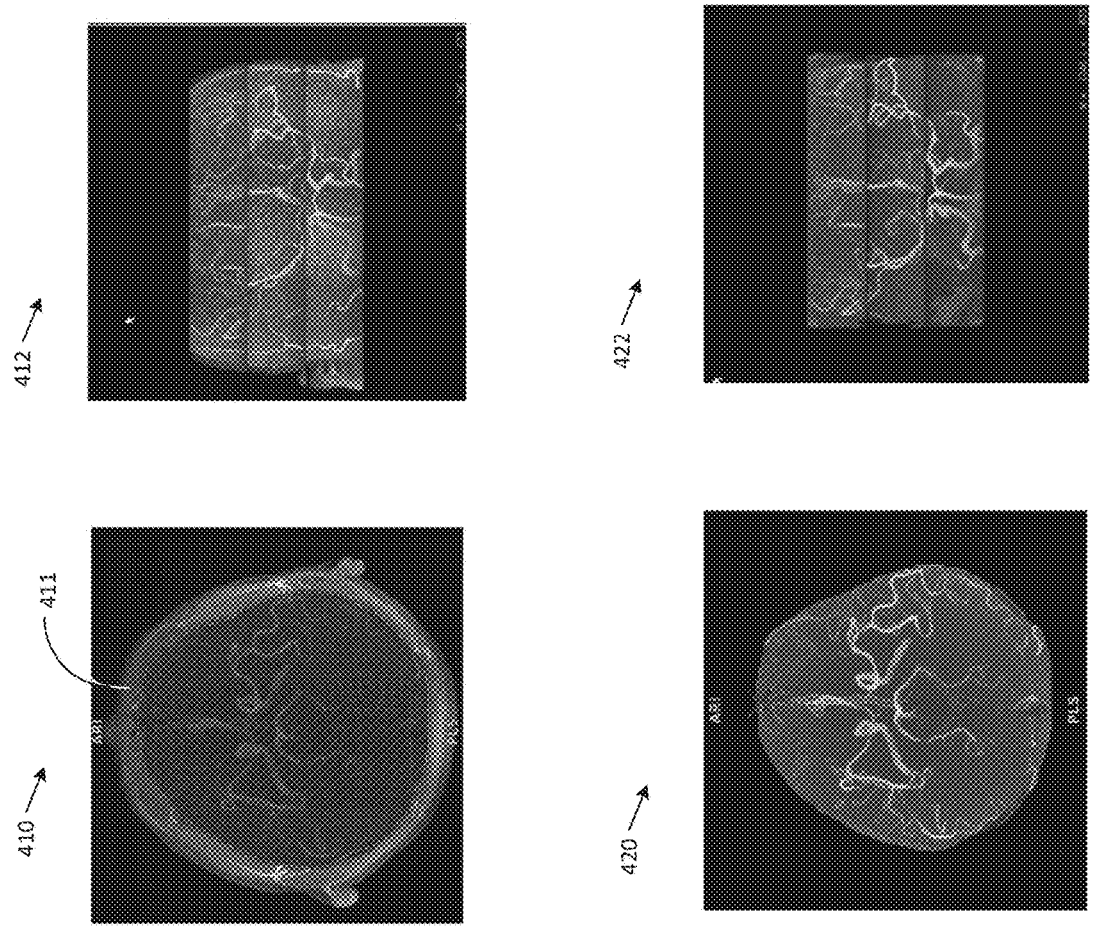
FIG. 4 is a schematic illustration of generating MIP images from TOF images, in accordance with an exemplary embodiment.

Referring to FIG. 4, a schematic illustration of generating MIP images 412 and 422 from TOF images 410 and 420 is shown, in accordance with an exemplary embodiment. MIP is a post-processing method which produces a projection image by casting "rays" through the stack of 2D or 3D slices and detecting the maximum pixel value. The result MIP image looks similar to an X-ray angiogram. Image 410 was a TOF image acquired by a conventional 3D TOF sequence. A layer of fat 411 was near the scalp and shown as a bright region in 410. Image 412 was an MIP image corresponding to 410 wherein three slabs were scanned. Due to the presence of fat 411, the contrast between blood vessels and background was not high. In image 420, the fat was manually cut off from image 410 and MIP was performed on the rest of the TOF image to generate an MIP image 422. As can be seen, in 420 and 422, the contrast between blood vessels and background was improved over 410 and 420.

Figure 5:
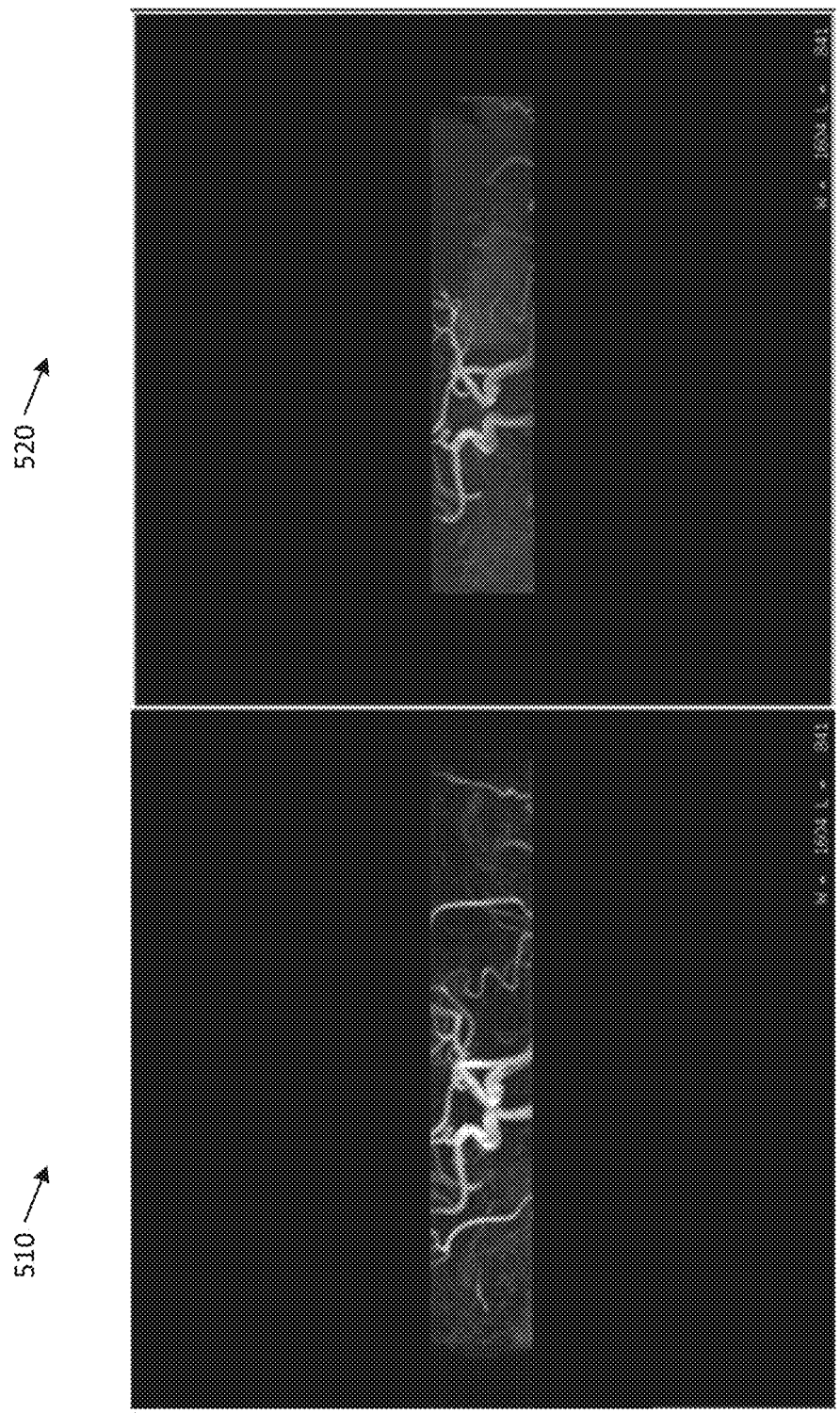
FIG. 5 is a comparison of MIP images obtained by the method disclosed herein and by a conventional method with restricted region, in accordance with an exemplary embodiment.

Referring to FIG. 5, a comparison of an MIP image 510 obtained from a 3D TOF subtraction method as disclosed herein and an MIP image 520 obtained by a conventional 3D TOF MRA with restricted volume is shown. As can be seen, the contrast of MIP image 510 is higher than that of MIP image 520. Small vessel 515 can be seen more clearly in 510 than in 520. As such, the method disclosed herein achieved better background suppression than the conventional method even with the restricted region in post processing.

Figure 6:
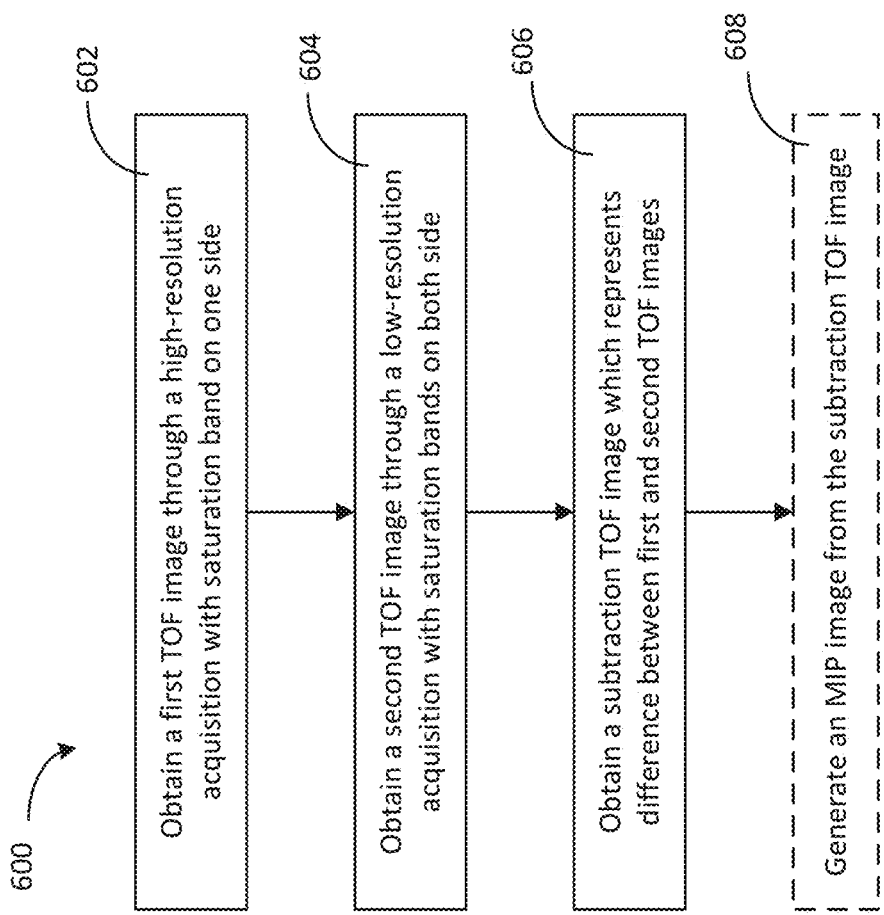
FIG. 6 is a flow chart of a method for suppressing background signal in 3D TOF MRA, in accordance with an exemplary embodiment.

Referring to FIG. 6, a flow chart 600 of a method for suppressing background signal in 3D TOF MRA is shown in accordance with an exemplary embodiment. The method can be performed by an MRI system, e.g., the MRI system 100 shown in FIG. 1. At an operation 602, a first TOF image is obtained through a high-resolution acquisition with a saturation band on one side of the imaging slab. In some embodiments, the first TOF image is obtained by applying the gradient echo pulse sequence shown in FIG. 3A, which includes a saturation pulse sequence and TOF acquisition pulse sequence. Saturation applies a 90° RF pulse in the presence of slice selection pulse to flip nuclei spins within the saturation band into the transverse plane. Dephasing gradients (also known as spoilers) are then applied to dephase the transverse magnetization. In some embodiments, venous blood flows from the saturation band to the imaging volume while arterial blood in an opposite direction.

Following saturation, TOF acquisition applies an RF excitation pulse in the presence of slice selection pulse to flip nuclei spins within the imaging slab. Then a gradient pulse is applied to slice encode along the axis of slice selection (Z-axis) and a gradient pulse to phase encode along the axis of phase encoding (Y-axis). These two gradient pulses are stepped through in such a way to cover the full $k_Y$ and $k_Z$ axes in the k-space. Following each combination of gradient pulses in slice selection and phase encoding directions, a readout gradient is applied to sample $k_X$ in the frequency encoding direction. The first TOF image may be reconstructed by 3D Fourier transform. In some embodiments, the arterial blood vessels have higher intensity than the stationary issues and venous blood vessels in the first TOF image.

At an operation 604, a second TOF image is obtained through a low-resolution acquisition with two saturation bands on both sides of the imaging slab. In some embodiments, the second TOF image is obtained by applying the gradient echo pulse sequence shown in FIG. 3B, which includes saturation and TOF acquisition. Saturation applies a 90° RF pulse in the presence of slice selection pulse to flip nuclei spins within two saturation bands on both sides of the imaging slab into the transverse plane. The RF pulse in the saturation of the second acquisition has two frequency centers and corresponding bandwidths to cover both saturation bands; while the RF pulse in the saturation of the first acquisition has one frequency center and bandwidth to cover one band. Dephasing gradients are then applied to dephase the transverse magnetization. In this way, both venous blood and arterial blood flowing from both sides to the imaging volume are saturated and will give no signal.

Following saturation, TOF acquisition applies an RF excitation pulse in the presence of slice selection pulse to flip nuclei spins within the imaging volume. Then a gradient pulse is applied to slice encode along the axis of slice selection (Z-axis) and a gradient pulse to phase encode along the axis of phase encoding (Y-axis). These two gradient pulses are stepped through in such a way to cover partial of $k_Y$ and $k_Z$ axes in the k-space. In other words, fewer $k_Y$ and $k_Z$ are sampled in the k-space in the second acquisition than in the first acquisition. In some embodiments, only the middle of the $k_Y$ and $k_Z$ axes (i.e., lower spatial frequencies) are sampled (e.g., ¼ in the middle of the $k_Y$ and $k_Z$ axes). Scan time is proportional to the number of slice encoding by the number of phase encoding. In some embodiments, the unsampled $k_Y$ and $k_Z$ axes may be filled with values of zero (0).

Following each combination of gradient pulses in slice selection and phase encoding directions, a readout gradient is applied to sample $k_X$ in the frequency encoding direction. In some embodiments, the number of samples along the frequency encoding direction (X-axis) is the same for the first and second acquisition so that the TR remains the same. As such, the blood flow behavior is substantially the same in each TR for the first and second acquisitions. The second TOF image may be reconstructed by 3D Fourier transform with zero filling.

At an operation 606, a subtraction TOF image is obtained which represents the difference between the first and second TOF images. In some embodiments, the subtraction TOF image is obtained by subtracting the second TOF image from the first TOF image. Because the unsampled k-space in the second acquisition is filled with values of zero, the second TOF image can have the same number of pixels (or voxels) as the first TOF image and the subtraction can be done pixel by pixel (or voxel by voxel).

At an optional operation 608, an MIP image is generated from the subtraction TOF image. In some embodiments, the MIP image is produced by casting "rays" through the stack of 3D slices and detecting the maximum pixel value. The result MIP image may look similar to an X-ray angiogram. In some embodiments, region(s) in the TOF image with high background signal may be cut off and MIP may be performed on the rest of the TOF image to generate the MIP image.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, the examples and embodiments, in all respects, are meant to be illustrative only and should not be construed to be limiting in any manner.

What is claimed is:

1. A method for suppressing background in time-of-flight (TOF) magnetic resonance angiography (MRA), the method comprising:
   obtaining a first TOF image through a high-resolution acquisition with a saturation band on one side of an imaging slab;
   obtaining a second TOF image through a low-resolution acquisition with one saturation band on each side of the imaging slab; and
   obtaining a subtraction TOF image which represents difference between the first and second TOF images.

2. The method of claim 1, further comprising:
   saturating nuclei spins within the saturation band on one side of the imaging slab;
   sampling full k-space for the imaging slab; and
   reconstructing the first TOF image from acquired full k-space data.

3. The method of claim 2, wherein venous blood flows from the saturation band to the imaging slab and arterial blood flows in an opposite direction.

4. The method of claim 2, further comprising:
   saturating nuclei spins within the two saturation bands on both sides of the imaging slab;
   sampling partial k-space for the imaging slab; and
   reconstructing the second TOF image from acquired partial k-space data.

5. The method of claim 4, wherein the partial k-space is in the middle of the full k-space.

6. The method of claim 4, further comprising:
   filling unsampled k-space with values of zero.

7. The method of claim 1, wherein a time for the low-resolution acquisition is 5-10% of a time for the high-resolution acquisition.

8. The method of claim 1, wherein a repetition time (TR) of the high-resolution acquisition is the same as a TR of the low-resolution acquisition.

9. The method of claim 1, wherein obtaining the subtraction TOF image comprises subtracting the second TOF image from the first TOF image pixel by pixel or voxel by voxel.

10. The method of claim 1, further comprising:
generating a maximum intensity projection (MIP) image from the subtraction TOF image.

11. The method of claim 1, wherein the TOF MRA is a three-dimensional (3D) TOF MRA.

12. A magnetic resonance imaging (MRI) system comprising:
a superconducting magnet configured to generate a homogenous longitudinal magnetic field;
a radio frequency (RF) coil configured to transmit RF pulses;
gradient coils configured to generate gradient magnetic field; and
a processor coupled to the RF coil and the gradient coils and configured to:
control the RF coil and the gradient coils to perform a high-resolution time-of-flight (TOF) acquisition with a saturation band on one side of an imaging slab; and
control the RF coil and the gradient coils to perform a low-resolution TOF acquisition with one saturation band on each side of the imaging slab.

13. The MRI system of claim 12, wherein in the high-resolution TOF acquisition, the processor controls the RF coil and the gradient coils to:
saturate nuclei spins within the saturation band on one side of the imaging slab; and
sample full k-space for the imaging slab.

14. The MRI system of claim 13, wherein in the low-resolution TOF acquisition, the processor controls the RF coil and the gradient coils to:
saturate nuclei spins within the two saturation bands on both sides of the imaging slab; and
sample partial k-space for the imaging slab.

15. The MRI system of claim 14, wherein the partial k-space is in the middle of the full k-space.

16. The MRI system of claim 12, wherein a time for the low-resolution acquisition is 5-10% of a time for the high-resolution acquisition.

17. The MRI system of claim 12, wherein a repetition time (TR) of the high-resolution acquisition is the same as a TR of the low-resolution acquisition.

18. The MRI system of claim 12, wherein the processor is further configured to:
reconstruct a first TOF image from data acquired by the high-resolution acquisition;
reconstruct a second TOF image from data acquired by the low-resolution acquisition; and
generate a subtraction TOF image which represents difference between the first and second TOF images.

19. The MRI system of claim 18, wherein the processor is further configured to:
fill unsampled k-space in the low-resolution acquisition with values of zero; and
subtract the second TOF image from the first TOF image pixel by pixel or voxel by voxel.

20. The MRI system of claim 18, wherein the processor is further configured to:
generate a maximum intensity projection (MIP) image from the subtraction TOF image.

* * * * *